(12) United States Patent
Suzuki et al.

(10) Patent No.: US 7,674,724 B2
(45) Date of Patent: Mar. 9, 2010

(54) OXIDIZING METHOD AND OXIDIZING UNIT FOR OBJECT TO BE PROCESSED

(75) Inventors: Keisuke Suzuki, Tokyo-To (JP); Toshiyuki Ikeuchi, Tokyo-To (JP); Kota Umezawa, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 70 days.

(21) Appl. No.: 12/213,784

(22) Filed: Jun. 24, 2008

(65) Prior Publication Data

US 2008/0268654 A1 Oct. 30, 2008

Related U.S. Application Data

(62) Division of application No. 11/059,630, filed on Feb. 17, 2005, now Pat. No. 7,419,550.

(30) Foreign Application Priority Data

Feb. 17, 2004 (JP) ............................ 2004-040637
Jan. 17, 2005 (JP) ............................ 2005-009631

(51) Int. Cl.
*H01L 21/469* (2006.01)
(52) U.S. Cl. ................... 438/773; 438/635; 438/770; 438/771; 438/E21.285
(58) Field of Classification Search ................. 438/635, 438/674, 769–774
See application file for complete search history.

(56) References Cited

U.S. PATENT DOCUMENTS 5,043,299 A 8/1991 Chang et al.

(Continued)

FOREIGN PATENT DOCUMENTS

| JP | 57-001232 | 1/1982 |
| JP | 03-140453 | 6/1991 |
| JP | 04-018727 | 1/1992 |
| JP | 2002-176052 | 6/2002 |
| KR | 2000-0035733 | 6/2000 |
| KR | 2001-0100932 | 11/2001 |

OTHER PUBLICATIONS

Korean Office Action issued on Jul. 30, 2008, with partial English translation.

*Primary Examiner*—Dung A. Le
(74) *Attorney, Agent, or Firm*—Smith, Gambrell & Russell, LLP

(57) ABSTRACT

An oxidizing method for an object to be processed according to the present invention includes: an arranging step of arranging a plurality of objects to be processed in a processing container whose inside can be vacuumed, the processing container having a predetermined length, a supplying unit of an oxidative gas being provided at one end of the processing container, a plurality of supplying units of a reducing gas being provided at a plurality of positions in a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere. The atmosphere forming step has: a selecting step of selecting a predetermined supplying unit of a reducing gas among the plurality of supplying units of a reducing gas, based on an arrangement number and respective arrangement positions of the plurality of objects to be processed in the processing container; an oxidative-gas supplying step of supplying the oxidative gas into the processing container by means of the supplying unit of an oxidative gas; and an reducing-gas supplying step of supplying the reducing gas into the processing container by means of only the supplying unit of a reducing gas selected by the selecting step.

13 Claims, 7 Drawing Sheets

U.S. PATENT DOCUMENTS

| | | |
|---|---|---|
| 6,037,273 A | 3/2000 | Gronet et al. |
| 6,159,298 A | 12/2000 | Saito |
| 6,383,300 B1 | 5/2002 | Saito et al. |
| 6,416,374 B1 | 7/2002 | Mitome et al. |
| 6,586,340 B2 | 7/2003 | Lee et al. |
| 7,304,002 B2 * | 12/2007 | Nishita et al. ............... 438/758 |
| 2003/0224618 A1 | 12/2003 | Sato et al. |
| 2005/0056219 A1 | 3/2005 | Dip et al. |

* cited by examiner

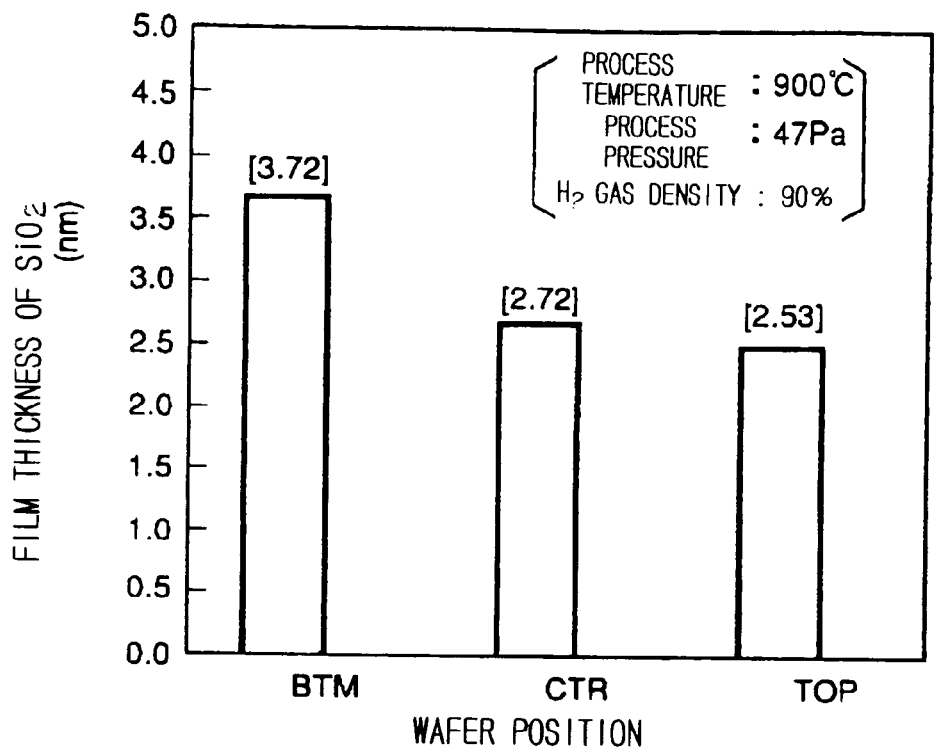
F I G. 2
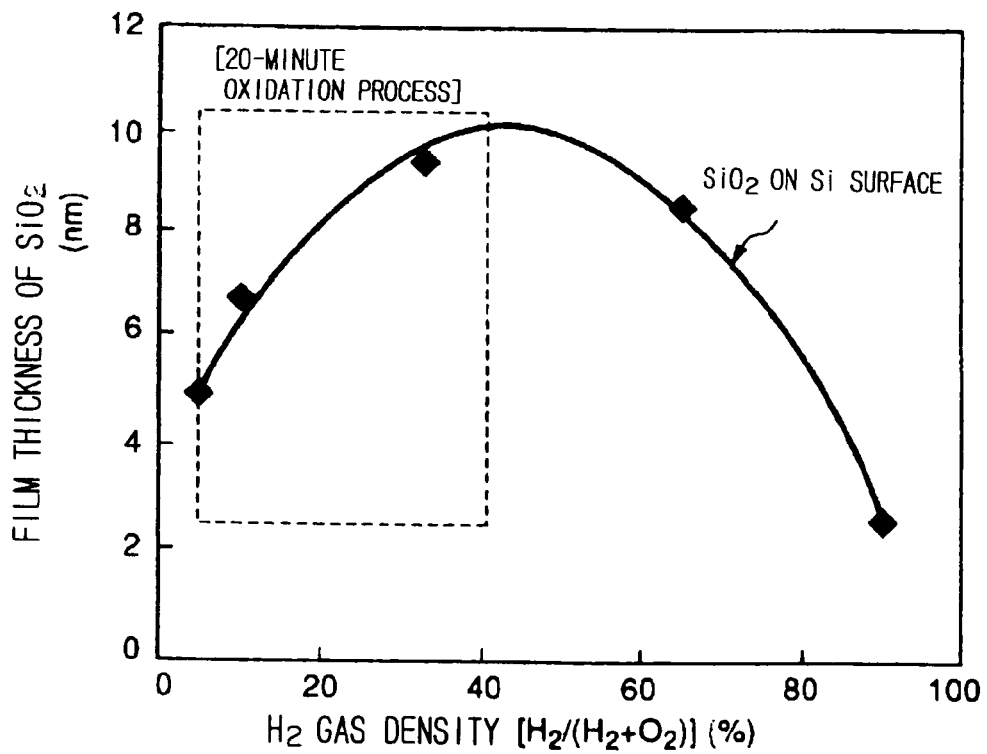
F I G. 3

OXIDIZING METHOD AND OXIDIZING UNIT FOR OBJECT TO BE PROCESSED

CROSS REFERENCE TO RELATED APPLICATION

This application is a division of Ser. No. 11/059,630, filed Feb. 17, 2005 now U.S. Pat. No. 7,419,550 and which is being incorporated in its entirety herein by reference.

FIELD OF THE INVENTION

This invention relates to an oxidizing method and an oxidizing unit for an object to be processed such as a semiconductor wafer or the like, which carries out an oxidation process to a surface of the object to be processed.

BACKGROUND ART

In general, in order to manufacture a desired semiconductor integrated circuit, various thermal processes including a film-forming process, an etching process, an oxidation process, a diffusion process, a modifying process or the like are carried out to a semiconductor wafer, which consists of a silicon substrate or the like. For example, as an oxidation process, there are known an oxidation process that oxidizes a surface of a single-crystal silicon film or a poly-silicon film, and another oxidation process that oxidizes a metal film, and so on. Such an oxidation process is mainly used for forming an insulation film such as a gate oxide film or a capacitor.

In view of a pressure, there are a normal-pressure oxidizing method that is carried out in a processing container under an atmosphere substantially the same as the atmospheric pressure, and a reduced-pressure oxidizing method that is carried out in a processing container under a vacuum. In addition, in view of a kind of gas used for the oxidation process, there are a wet oxidizing method that uses moisture vapor generated by burning hydrogen and oxygen by means of an outside burning unit (for example, JP A 3-140453), and a dry oxidizing method that causes only ozone or oxygen to flow into a processing container without using moisture vapor (for example, JP A 57-1232).

Herein, taking into consideration film characteristics as an insulation film such as pressure resistance, corrosion resistance, reliability or the like, in general, an insulation film formed by a wet oxidizing process is superior to an insulation film formed by a dry oxidizing process.

In addition, in general, an oxide film formed by a wet oxidizing process under a normal pressure can achieve a great oxidation rate, but is inferior in uniformity within a surface of a film thickness. On the other hand, an oxide film formed by a wet oxidizing process under a reduced pressure can achieve only a small oxidation rate, but is superior in uniformity within a surface of a film thickness.

Conventionally, design rules for a semiconductor integrated circuit were not so severe. Thus, the above various oxidizing methods were suitably selected taking into consideration use application of the oxide film, process condition for forming the oxide film, apparatus cost for forming the oxide film or the like.

However, recently, a wire width and/or a film thickness have been decreased so that the design rules for a semiconductor integrated circuit have become more severe. Thus, better film characteristics and/or higher uniformity within a surface of a film thickness have been required. The conventional oxidizing methods can not cope with the requests sufficiently.

An example of a wet oxidizing method is disclosed in JP A 4-18727. In this example, an $H_2$ gas and an $O_2$ gas are separately introduced into a lower-end portion of a longitudinal quartz reaction tube, and then burned at a burning part provided in a quartz cap. Moisture vapor is generated by the burning reaction. The moisture vapor rises up along an arrangement direction of wafers and oxidizes the wafers. In the case, the $H_2$ gas is burned at the burning part, so that the lower-end portion of the processing container becomes rich in the moisture vapor. As the moisture vapor rises up, the moisture vapor is consumed. Thus, to the contrary, an upper-end portion of the processing container becomes short in the moisture vapor. Thus, film thicknesses of the oxide films formed on the wafers may be greatly different depending on supporting positions of the wafers. That is, uniformity between surfaces of a film thickness of the oxide films may be deteriorated.

In addition, in an oxidizing unit disclosed in JP A 57-1232, a plurality of semiconductor wafers are arranged alongside in a horizontal batch type of reaction tube. An $O_2$ gas may be solely introduced into an end portion of the reaction tube. Alternatively, an $O_2$ gas and an $H_2$ gas may be simultaneously introduced thereinto. Then, an oxide film is generated under a reduced-pressure atmosphere. However, in the conventional unit, the film-forming process is carried out by using a hydrogen-burning oxidizing method under an atmosphere whose pressure is relatively high. That is, the moisture vapor is main in the reaction. Thus, as described above, density difference of the moisture vapor may be generated between an upstream side and a downstream side of the gases in the processing container. Thus, uniformity between surfaces of a film thickness of the oxide films may be deteriorated.

In addition, in a unit disclosed in the specification of U.S. Pat. No. 6,037,273, an oxygen gas and a hydrogen gas are supplied into a single-wafer type of process chamber, which is heated by a lamp. The both gases react in the vicinity of a surface of a semiconductor wafer arranged in the process chamber so as to generate moisture vapor. The moisture vapor oxidizes silicon of the wafer surface, so that an oxide film is formed.

However, in the unit as well, the oxygen gas and the hydrogen gas are introduced into the process chamber from gas ports which are located away from the wafer by about 20 to 30 mm, and the process pressure is relatively high. Thus, uniformity within a surface of a film thickness is inferior.

In order to solve the above problems, JP A 2002-176052 by the applicant discloses an oxidizing method wherein an oxidative gas such as an $O_2$ gas and an reducing gas such as an $H_2$ gas are simultaneously supplied into an upper portion and a lower portion of a process chamber respectively, and react on each other under a vacuum atmosphere in order to form an atmosphere mainly consisting of oxidation active species and active hydroxyl species. In that atmosphere, the silicon wafer or the like may be oxidized.

The oxidizing method is explained simply with reference to FIG. 9. FIG. 9 is a schematic structural view showing an example of a conventional oxidizing unit. The oxidizing unit 102 shown in FIG. 9 has a longitudinal cylindrical processing container 106. A resistance heater 104 is arranged around the processing container 106. In the processing container 106, a wafer boat 108 is arranged, which can be moved up and down in order to be loaded and unloaded through a lower end of the processing container 106. Semiconductor wafers W consisting of silicon substrates or the like are placed and held on the wafer boat 108 in a tier-like manner. An $H_2$-gas nozzle 110 for supplying an $H_2$ gas and an $O_2$-gas nozzle 112 for supplying an $O_2$ gas are provided at a lower side wall of the processing container 106. A gas-discharging port 114 connected to a vacuum pump not shown or the like is provided at an upper portion of the processing container 106.

The $H_2$ gas and the $O_2$ gas introduced into (a lower portion of) the processing container 106 from the both nozzles 110, 112 react on each other in the processing container 106, for example under a pressure smaller than 133 Pa, in order to generate active oxygen species and active hydroxyl species. These active species rise up in the processing container 106, come in contact with surfaces of the wafers W, and oxidize the surfaces.

According to the oxidizing methods disclosed in the above six documents, an oxide film having good film characteristics can be formed, and the uniformity within a surface of a film thickness of the oxide film can be maintained high.

However, according to the oxidizing methods disclosed in the above six documents, density of the active species is high on an upstream side of the gas flow, but low on a downstream side thereof, so that uniformity between surfaces of a film thickness is very low, which corresponds to a degree of film-thickness difference between the wafers.

In addition, recently, use application of the semiconductor integrated circuit has been widened, so that tendency of many-kind small-volume production has become stronger. That is, when a maximum containing capacity for production wafers of the wafer boat 8 is about 50 to 150, some process may be carried out under a state wherein production wafers whose number is smaller than the capacity are contained.

When the production wafers are short, it is not preferable to carry out an oxidation process under a process condition for a normal full-wafer state (gas flow rate or the like) while one or more vacant areas remain. The production wafer has a very large surface area because a pattern is formed on a surface thereof. Thus, the production wafer tends to consume a large amount of the active species. The degree of consumption of the active species is called a loading effect. Because of the loading effect, depending on a containing manner of the production wafers in the wafer boat (containing number and/or containing positions), distribution and/or an amount of the active species may be greatly changed. This may have a bad effect on the uniformity between surfaces of a film thickness.

Then, in general, when the production wafers are short, dummy wafers are used to fill the wafer boat 108. Thus, conditions in the processing container 106 such as temperature distribution and/or gas flows are maintained at substantially the same as the normal full-wafer state.

However, the dummy wafers are relatively expensive. Thus, production cost may be increased thereby.

The inventor has studied to compensate a change of heat distribution caused by the vacant areas by a temperature adjustment of heating units that can be controlled independently for each zone, when the vacant areas remain in the wafer boat 108 without using the dummy wafers. However, in the case, thermal history of the production wafers may be changed. Thus, it is difficult to adopt this manner.

SUMMARY OF THE INVENTION

This invention is developed by focusing the aforementioned problems in order to resolve them effectively. The object of this invention is to provide an oxidizing method and an oxidizing unit for an object to be processed, wherein uniformity between surfaces of a film thickness of oxide films can be maintained high without using a dummy wafer even when a containing manner of objects to be processed for products in a wafer boat is changed under a state in which temperature distribution in a processing container is maintained constant.

The present invention is an oxidizing method for an object to be processed, the oxidizing method comprising: an arranging step of arranging a plurality of objects to be processed in a processing container whose inside can be vacuumed, the processing container having a predetermined length, a supplying unit of an oxidative gas being provided at one end of the processing container, a plurality of supplying units of a reducing gas being provided at a plurality of positions in a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere; wherein the atmosphere forming step has: a selecting step of selecting a predetermined supplying unit of a reducing gas among the plurality of supplying units of a reducing gas, based on an arrangement number and respective arrangement positions of the plurality of objects to be processed in the processing container; an oxidative-gas supplying step of supplying the oxidative gas into the processing container by means of the supplying unit of an oxidative gas; and an reducing-gas supplying step of supplying the reducing gas into the processing container by means of only the supplying unit of a reducing gas selected by the selecting step.

According to the invention, since the reducing gas is supplied into the processing container by means of only the supplying unit of a reducing gas selected by the selecting step based on an arrangement number and respective arrangement positions of the plurality of objects to be processed, uniformity between surfaces of a film thickness of oxide films can be maintained high without depending on the arrangement number and respective arrangement positions of the plurality of objects to be processed.

For example, the supplying unit of a reducing gas selected by the selecting step is a supplying unit of a reducing gas determined in advance, based on film thicknesses of oxide films formed by supplying the reducing gas by respective selective patterns of the plurality of supplying units of a reducing gas, in such a manner that uniformity between surfaces of the film thicknesses of the oxide films is high.

Preferably, the reducing gas is supplied in the reducing-gas supplying step while the reducing gas is controlled to an optimum flow rate.

In addition, preferably, density of the reducing gas in total of the oxidative gas and the reducing gas is between 5% and 40%.

In addition, preferably, the oxidative gas includes one or more gases selected from a group consisting of $O_2$, $N_2O$, NO, $NO_2$ and $NO_3$, and the reducing gas includes one or more gases selected from a group consisting of $H_2$, $NH_3$, $CH_4$, HCl and deuterium.

For example, the objects to be processed consist of a production wafer and a monitor wafer. Alternatively, the objects to be processed may consist of only production wafers.

In addition, the present invention is an oxidizing unit comprising: a processing container whose inside can be vacuumed, the processing container having a predetermined length; a supplying unit of an oxidative gas provided at one end of the processing container; a plurality of supplying units of a reducing gas provided at a plurality of positions in a longitudinal direction of the processing container; a holding unit that supports a plurality of objects to be processed at a predetermined pitch, and that can be arranged in the processing container; and a controlling unit that selects a predetermined supplying unit of a reducing gas from the plurality of supplying units of a reducing gas, based on an arrangement number and respective arrangement positions of the plurality of objects to be processed in the processing container, and that controls the plurality of supplying units of a reducing gas so as to supply the reducing gas into the processing container only from the predetermined supplying unit of a reducing gas.

According to the invention, since the reducing gas is supplied into the processing container by means of only the supplying unit of a reducing gas selected based on an arrangement number and respective arrangement positions of the plurality of objects to be processed, uniformity between surfaces of a film thickness of oxide films can be maintained high without depending on the arrangement number and the respective arrangement positions of the plurality of objects to be processed.

For example, the predetermined supplying unit of a reducing gas is a supplying unit of a reducing gas determined in advance, based on film thicknesses of oxide films formed by supplying the reducing gas by respective selective patterns of the plurality of supplying units of a reducing gas, in such a manner that uniformity between surfaces of the film thicknesses of the oxide films is high.

For example, the holding unit may hold the objects to be processed whose number is smaller than a maximum capacity of the holding unit, so that the holding unit may have a vacant area.

Preferably, the oxidative gas includes one or more gases selected from a group consisting of $O_2$, $N_2O$, $NO$, $NO_2$ and $NO_3$, and the reducing gas includes one or more gases selected from a group consisting of $H_2$, $NH_3$, $CH_4$, $HCl$ and deuterium.

For example, the objects to be processed consist of a production wafer and a monitor wafer. Alternatively, the objects to be processed may consist of only production wafers.

In addition, the present invention is a controlling unit for controlling an oxidizing unit including: a processing container whose inside can be vacuumed, the processing container having a predetermined length; a supplying unit of an oxidative gas provided at one end of the processing container; a plurality of supplying units of a reducing gas provided at a plurality of positions along a longitudinal direction of the processing container; and a holding unit that supports a plurality of objects to be processed at a predetermined pitch, and that can be arranged in the processing container; the controlling unit being adapted to select a predetermined supplying unit of a reducing gas from the plurality of supplying units of a reducing gas, based on an arrangement number and respective arrangement positions of the plurality of objects to be processed in the processing container, and to control the plurality of supplying units of a reducing gas in order to supply the reducing gas into the processing container only from the predetermined supplying unit of a reducing gas.

Alternatively, the present invention is a program for controlling an oxidizing unit including: a processing container whose inside can be vacuumed, the processing container having a predetermined length; a supplying unit of an oxidative gas provided at one end of the processing container; a plurality of supplying units of a reducing gas provided at a plurality of positions along a longitudinal direction of the processing container; and a holding unit that supports a plurality of objects to be processed at a predetermined pitch, and that can be arranged in the processing container; the program being adapted to cause a computer to execute: a selecting procedure for selecting a predetermined supplying unit of a reducing gas from the plurality of supplying units of a reducing gas, based on an arrangement number and respective arrangement positions of the plurality of objects to be processed in the processing container; and a controlling procedure for controlling the plurality of supplying units of a reducing gas in order to supply the reducing gas into the processing container only from the predetermined supplying unit of a reducing gas.

Alternatively, the present invention is a storage medium capable of being read by a computer, storing the above program.

Alternatively, the present invention is a storage medium capable of being read by a computer, storing software for controlling an oxidizing method for an object to be processed, the oxidizing method comprising: an arranging step of arranging a plurality of objects to be processed in a processing container whose inside can be vacuumed, the processing container having a predetermined length, a supplying unit of an oxidative gas being provided at one end of the processing container, a plurality of supplying units of a reducing gas being provided at a plurality of positions along a longitudinal direction of the processing container; an atmosphere forming step of supplying the oxidative gas and the reducing gas into the processing container in order to form an atmosphere having active oxygen species and active hydroxyl species in the processing container; and an oxidizing step of oxidizing surfaces of the plurality of objects to be processed in the atmosphere; wherein the atmosphere forming step has: a selecting step of selecting a predetermined supplying unit of a reducing gas among the plurality of supplying units of a reducing gas, based on an arrangement number and respective arrangement positions of the plurality of objects to be processed in the processing container; an oxidative-gas supplying step of supplying the oxidative gas into the processing container by means of the supplying unit of an oxidative gas; and an reducing-gas supplying step of supplying the reducing gas into the processing container by means of the supplying unit of a reducing gas selected by the selecting step.

BRIEF DESCRIPTION OF THE DRAWINGS

FIG. 2 is a graph showing a relationship between wafer positions and film thicknesses of $SiO_2$ films;

FIG. 3 is a graph showing a relationship between densities of an $H_2$ gas and film thicknesses of $SiO_2$ films;

DESCRIPTION OF THE PREFERRED EMBODIMENT

Hereinafter, an embodiment of an oxidizing method and an oxidizing unit according to the present invention is explained with reference to attached drawings.

Figure 1:
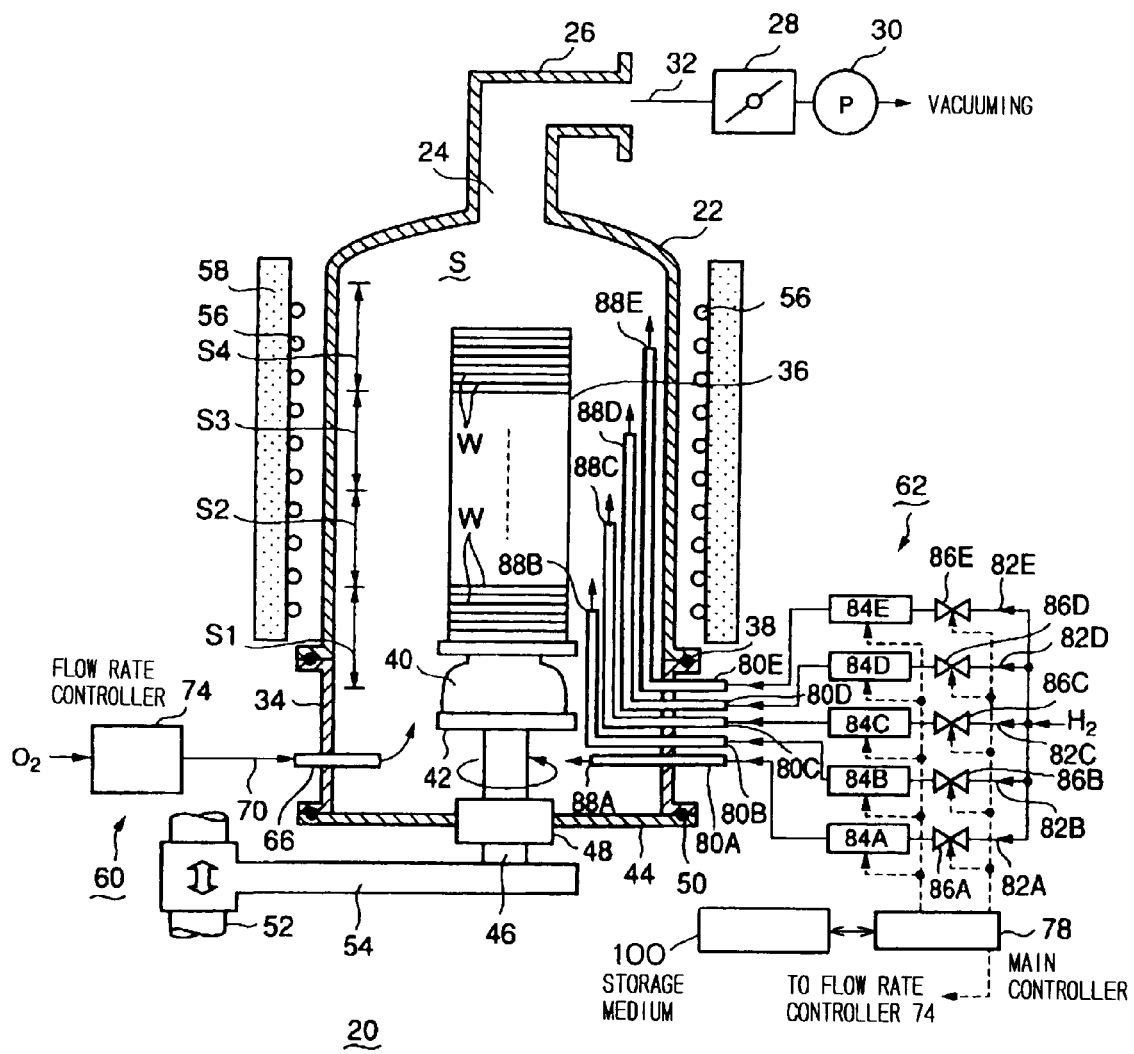
FIG. 1 is a schematic structural view showing an embodiment of an oxidizing unit according to the present invention.

FIG. 1 is a schematic structural view showing the embodiment of an oxidizing unit according to the present invention.

As shown in FIG. 1, an oxidizing unit 20 according to the embodiment of the invention has a cylindrical processing container 22 whose lower end is open. The processing container 22 may be made of for example quartz whose heat resistance is high. The processing container 22 has a predetermined length.

An open gas-discharging port 24 is provided at a ceiling part of the processing container 22. A gas-discharging line 26 that has been bent at a right angle in a lateral direction is provided to connect with the gas-discharging port 24. A gas-discharging system 32 including a pressure-control valve 28 and a vacuum pump 30 and the like on the way is connected to the gas-discharging line 26. Thus, the atmospheric gas in the processing container 22 can be discharged. Herein, the inside of the processing container 22 may be a vacuum or a substantially normal-pressure atmosphere, depending on a process manner.

A lower end of the processing container 22 is supported by a cylindrical manifold 34 made of for example stainless steel. Under the manifold 34, a wafer boat 36 made of quartz as a holding unit, on which a large number of semiconductor wafers W as objects to be processed are placed in a tier-like manner at a predetermined pitch, is provided in a vertically movable manner. The wafer boat 36 can be inserted into and taken out from the processing container 22, through a lower opening of the manifold 34 In the embodiment, for example about 50 wafers W having a 300 mm diameter may be supported in a tier-like manner at substantially the same interval (pitch) by the wafer boat 36. A sealing member 38 such as an O-ring is interposed between a lower end of the processing container 22 and an upper end of the manifold 34. Thus, airtightness between the processing container 22 and the manifold 34 is maintained.

The wafer boat 36 is placed above a table 42 via a heat-insulating cylinder 40 made of quartz. The table 42 is supported on a top part of a rotation shaft 28 that penetrates a lid member 44 for opening and closing the lower end opening of the manifold 34.

For example, a magnetic-fluid seal 48 is provided at a penetration part of the lid member 44 by the rotation shaft 28. Thus, the rotation shaft 28 can rotate while maintaining airtightness by the lid member 44. In addition, a sealing member 50 such as an O-ring is provided between a peripheral portion of the lid member 44 and a lower end portion of the manifold 34. Thus, airtightness between the lid member 44 and the manifold 34 is maintained, so that airtightness in the processing container 22 is maintained.

The rotation shaft 28 is attached to a tip end of an arm 54 supported by an elevating mechanism 52 such as a boat elevator. When the elevating mechanism 52 is moved up and down, the wafer boat 36 and the lid member 44 and the like may be integrally moved up and down.

Herein, the table 42 may be fixed on the lid member 44. In the case, the wafer boat 36 doesn't rotate while the process to the wafers W is conducted.

A heating unit 56, which consists of for example a heater made of a carbon-wire disclosed in JP A 2003-209063, is provided at a side portion of the processing container 22 so as to surround the processing container 22. The heating unit 56 is capable of heating the semiconductor wafers W located in the processing container 22. The carbon-wire heater can achieve a clean process, and is superior in characteristics of rise and fall of temperature.

A heat insulating material 58 is provided around the outside periphery of the heating unit 56. Thus, the thermal stability of the heating unit 56 is assured.

In addition, various gas-supplying units are provided at the manifold 34, in order to introduce various kinds of gases into the processing container 22.

Specifically, at the manifold 34, an oxidative-gas supplying unit 60 that supplies an oxidative gas into the processing container 22 and a plurality of reducing-gas supplying units 62 that supplies a reducing gas into the processing container 22 are respectively provided.

The oxidative-gas supplying unit 60 has a oxidative-gas ejecting nozzle 66 that pierces the side wall of the manifold 34. A tip portion of the oxidative-gas ejecting nozzle 66 is located in an area on a lower end side in the processing container 22. On the way of a gas passage 70 extending from the oxidative-gas ejecting nozzle 66, a flow-rate controller 74 such as a mass flow controller is provided. A main controller 78 consisting of a micro computer or the like is adapted to control the flow-rate controller 74 to control a supply flow rate of the oxidative gas into the processing container 22.

The main controller 78 has also a function of controlling the whole operation of the oxidizing unit 20. The operation of the oxidizing unit 20, which is described below, is carried out based on commands from the main controller 78. In addition, the main controller 78 has a storage medium 100 such as a floppy disk or a flash memory in which a program for carrying out various control operations has been stored in advance. Alternatively, the main controller 78 is connected (accessible) to the storage medium 100.

In addition, the plurality of reducing-gas supplying units 62 as a feature of the present invention is provided at a plurality of different positions in a longitudinal direction of the processing container 22. In the shown example, as the reducing-gas supplying units 62, five reducing-gas ejecting nozzles 80A, 80B, 80C, 80D and 80E are provided, each of which penetrates the side wall of the manifold 34. The reducing-gas ejecting nozzle 80A is linear, but the reducing-gas ejecting nozzles 80B to 80E are bent upwardly in a L-shape in the processing container 22. Tip portions of the reducing-gas ejecting nozzles 80A to 80E are formed as gas ejecting ports 88A, 88B, 88C, 88D and 88E. The respective gas ejecting ports 88A to 88E are arranged at different positions in the longitudinal (vertical) direction of the processing container 22.

On the ways of respective gas passages 82A, 82B, 82C, 82D and 82E extending from the respective reducing-gas ejecting nozzles 80A to 80E, flow-rate controller 84A, 84B, 84C, 84D and 84E such as mass flow controllers and open-close valves 86A, 86B, 86C, 86D and 86E are provided. The main controller 78 is adapted to control the flow-rate controllers 84A, 84B, 84C, 84D and 84E and the open-close valves 86A, 86B, 86C, 86D and 86E in order to independently control respective supply flow rates of the reducing gas into the processing container 22, including to stop the supply. Specifically, as described below, the reducing gas is supplied at respective predetermined gas flow rates, during the oxidation process, from only selected nozzles among the reducing-gas ejecting nozzles 80A to 80E.

In the shown example, a containing area S of the wafer W in the processing container 22 is conceptionally divided into four zones along a gas flow direction, that is, an upstream zone S1, an up-midstream zone S2, a mid-downstream zone S3, and a downstream zone S4. The gas ejecting port 88A of the lowest reducing-gas ejecting nozzle 80A is located at an area on the lower-end side in the processing container 22 (on the upstream side of the gas flow). Then, the gas ejecting ports 88B to 88E are respectively located at the flow zones S1 to s4.

More specifically, in the shown example, the gases introduced into the processing container 22 flow upwardly in the containing area S from the introduction positions, and go out through the gas-discharging port 24 provided at the upper end portion of the processing container 22. Then, the containing area S of the wafers W is set to be a little larger in a vertical direction than a length of the wafer boat 36, and is expedientially divided into the four zones along the gas flow direction, that is, the upstream zone S1 (lower zone in FIG. 1), the up-midstream zone S2 (mid-lower zone in FIG. 1), the mid-downstream zone S3 (mid-upper zone in FIG. 1), and the downstream zone S4 (upper zone in FIG. 1).

Then, as shown in FIG. 1, the gas ejecting port 88B of the second shortest reducing-gas ejecting nozzle 80B is located in the upstream zone S1. More specifically, it is preferable that the gas ejecting port 88B is located in the vicinity of a lower end of the wafer boat 36. In addition, it is preferable that the gas ejecting port 88C of the reducing-gas ejecting nozzle 80C is located at a substantial center of the up-midstream zone S2, that the gas ejecting port 88D of the reducing-gas ejecting nozzle 80D is located at a substantial center of the mid-downstream zone S3, and that the gas ejecting port 88E of the longest reducing-gas ejecting nozzle 80E is located in the upstream zone S4 at a position a little lower than an upper end of the wafer boat 36. Herein, the lowest reducing-gas ejecting nozzle 80A forms a main nozzle for supplying the reducing gas. At an oxidation process, the reducing gas is supplied from the main nozzle at a relatively high frequency.

The above areal division is only an example. The number of divided zones may be smaller and larger, and a reducing-gas ejecting nozzle may be provided in each zone. In addition, for example, an $O_2$ gas may be used as the oxidative gas, and an $H_2$ gas may be used as the reducing gas. In addition, if necessary, an inert-gas supplying unit, which is not shown but supplies an inert gas such as an $N_2$ gas, may be provided.

Next, an oxidizing method carried out by using the oxidizing unit 20 is explained. As described above, the operations of the oxidizing unit 20 are carried out based on the commands from the main controller 78 based on the program stored in the storage medium 100.

When the semiconductor wafers W consisting of for example silicon wafers are unloaded and the oxidizing unit 20 is under a waiting state, the processing container 22 is maintained at a temperature, which is lower than a process temperature. Then, the wafer boat 36 on which a large number of, for example one hundred being the maximum containing capacity or the below, wafers W (production wafers) of a normal temperature are placed is moved up and loaded into the processing container 22 in a hot-wall state from the lower portion thereof. The lid member 44 closes the lower end opening of the manifold 34, so that the inside of the processing container 22 is hermetically sealed. As described above, the semiconductor wafers as the objects to be processed are production wafers. When the number of the production wafers W is smaller than the maximum containing capacity of the wafer boat 36, vacant areas may be left in the wafer boat 36.

Then, the inside of the processing container 22 is vacuumed and maintained at a predetermined process pressure. On the other hand, electric power supplied to the heating unit 56 is increased so that the wafer temperature is raised and stabilized at a process temperature for the oxidation process. After that, predetermined process gases, herein the $O_2$ gas and the $H_2$ gas, are respectively supplied from the gas ejecting nozzle 66 of the oxidative-gas supplying unit 60 and selected nozzles among the gas ejecting nozzles 80A to 80E of the reducing-gas supplying unit 62 into the processing container 22 while the flow rates of the gases are controlled.

The both gases ascend in the processing container 22 and react on each other in a vacuum atmosphere in order to generate the active hydroxyl species and the active oxygen species. The active species come in contact with the wafers W contained in the rotating wafer boat 36. Thus, the oxidation process is conducted to the wafer surfaces. Then, the respective process gases and a reaction product gas are discharged outside from the gas-discharging port 24 at the ceiling part of the processing container 22.

The flow rate of the $H_2$ gas is within 200 to 5000 sccm, for example 270 sccm. The flow rate of the $O_2$ gas is within 50 to 10000 sccm, for example 2430 sccm.

As described above, the $H_2$ gas and the $O_2$ gas separately introduced into the processing container 22 ascend in the processing container 22 of a hot-wall state, cause a burning reaction of hydrogen in the vicinity of the wafers W, and form an atmosphere mainly consisting of the active oxygen species (O*) and the active hydroxyl species (OH*). These active species oxidize the surfaces of the wafers W so that $SiO_2$ films are formed.

Regarding the process condition at that time, the wafer temperature is within 400 to 1000° C., for example 900° C., and the pressure is within 13.3 to 1330 Pa, for example 133 Pa (1 Torr). In addition, the processing time is for example about 10 to 30 minutes although it depends on a film thickness of the formed film.

Herein, a forming process of the active species is thought as follows. That is, since the hydrogen and the oxygen are separately introduced into the processing container 22 of a hot-wall state under a reduced-pressure atmosphere, it may be thought that the following burning reaction of the hydrogen is promoted near to the wafers W. In the following expressions, chemical symbols with a mark "*" mean active species thereof.

$$H_2+O_2 \rightarrow H^*+HO_2$$

$$O_2+H^* \rightarrow OH^*+O^*$$

$$H_2+O^* \rightarrow H^*+OH^*$$

$$H_2+OH^* \rightarrow H^*+H_2O$$

As described above, when the $H_2$ gas and the $O_2$ gas are separately introduced into the processing container 22, the O* (active oxygen species) and the OH* (active hydroxyl species) and the $H_2O$ (moisture vapor) are generated during the burning reaction of the hydrogen. These (O*, OH*, $H_2O$) oxide the wafer surfaces, so that the $SiO_2$ films are formed. At that time, in particular, it is thought that the O* and the OH* greatly contribute to the oxidation effect.

Herein, in the present embodiment, among the reducing-gas ejecting nozzles 80A to 80E, from nozzles selected based on the containing manner of the wafers W, the $H_2$ gas is supplied to the respective corresponding zones in the containing area S at respective necessary flow rates. The $H_2$ gas reacts on the $O_2$ gas ascending in the processing container 22 serially. Then, as shown by the above expressions, in order to compensate a shortage of the active oxygen species and/or the active hydroxyl species because of consumption thereof and/or loss of activity thereof, the active oxygen species and/or the active hydroxyl species are generated. Thus, in a between-surface direction (vertical direction), an appropriate amount of the active species exists in every vertical position. That is, density of the active species may be made uniform. Thus, uniformity between surfaces of a film thickness of oxide films selectively formed on surfaces of silicon layers can be improved.

Herein, the nozzles selected from the reducing-gas ejecting nozzles 80A to 80E in order to supply the $H_2$ gas (reducing gas) have been determined in advance based on the number and the positions of the product wafers W contained in the wafer boat 36. In the present embodiment, the nozzle or nozzles to be selected have been determined in advance by a simulation, based on film thicknesses of respective oxide films formed at oxidation processes using respective nozzle combinations (selective patterns) from the reducing-gas ejecting nozzles 80A to 80E, in such a manner that uniformity between surfaces of the film thicknesses is high. The nozzle 80A located on the most upstream side of the gas flow, which may have an effect on the whole area in the processing container 22, is selected as the main nozzle for almost every wafer arrangement manner. That is, specific combinations of the five reducing-gas ejecting nozzles 80A to 80E are: (1) the nozzle 80A and the nozzle 80B; (2) the nozzle 80A and the nozzle 80E; (3) the nozzle 80A, the nozzle 80C and the nozzle 80D; (4) the nozzle 80A, the nozzle 80B and the nozzle 80C; (5) all the nozzles 80A to 80E; and so on. The reducing gas is not supplied from unselected nozzles because the corresponding open-closing valves are closed.

As described above, the film thicknesses of respective oxide films formed at oxidation processes using respective nozzle combinations to be selected are measured in advance, the simulation is carried out based on the measured values, and a nozzle selective pattern to be actually selected is determined in advance for each possible wafer arrangement manner from the reducing-gas ejecting nozzles 80A to 80E. The simulation step may be omitted when the film-thickness measuring experiment may be carried out for each possible wafer arrangement manner.

Next, a specific example of process for selecting reducing-gas ejecting nozzles is explained in detail.

<Film Thickness of $SiO_2$>

At first, film thicknesses of $SiO_2$ formed by oxidation processes were measured. The result is shown in FIG. 2. FIG. 2 is a graph showing a relationship between wafer positions and the film thicknesses of $SiO_2$ films. The "BTM (bottom)", the "CTR (center)" and the "TOP (top)" correspond to a lower position, a central position and an upper position in a height direction of the wafer boat 36 of FIG. 1.

Regarding the process condition at that time, the process pressure was 47 Pa (0.35 torr), the process temperature was 900° C., the density of the $H_2$ gas ($H_2/(H_2+O_2)$) was 90%. In addition, in the wafer boat 36, one hundred product wafers (bare wafers) were contained, whose number was the maximum containing capacity. In addition, wafers to be monitored were arranged at predetermined positions for measuring film thicknesses.

As clearly seen from FIG. 2, the film thickness at the "BTM" on the upstream side of the gas flow was the greatest. The film thickness at the "CTR" and the film thickness at the "TOP" were smaller in that order. It is thought that the reason is because the active species were less in the zones of the "CTR" and the "TOP".

Thus, in order to improve the uniformity between surfaces of the film thickness, it was found that it is necessary to adjust the film thicknesses at the "CTR" and the "TOP" to be greater.

<Relationship Between Density of $H_2$ Gas and Film Thickness of $SiO_2$>

Then, a relationship between densities of the $H_2$ gas and the film thicknesses of $SiO_2$ films was studied. FIG. 3 is a graph showing a relationship between densities of the $H_2$ gas ($H_2/(H_2+O_2)$) and the film thicknesses of $SiO_2$ films. The density of the $H_2$ gas was changed within 5% to 90%, and each oxidation process was carried out for 20 minutes to form the shown film thickness. As shown in FIG. 3, in the area not larger than 40% for the density of the $H_2$ gas (shown by a dotted line in FIG. 3), as the density of the $H_2$ gas is higher, the film thickness is greater. Thus, in the area not larger than 40% for the density of the $H_2$ gas, it was confirmed that it is sufficient to increase the density of the $H_2$ gas by supplying the $H_2$ gas to an area where a greater film thickness is desired. Then, herein, the $H_2$ gas is mainly supplied from the main nozzle 80A, and auxiliary supplied on the way of the gas flow in the processing container 22. In addition, if the density of the $H_2$ gas is too low, the oxidation speed may be too low, so that the throughput may be too small. Thus, the lower limit of the density of the $H_2$ gas is about 5%.

<Containing Manner of Product Wafers and Monitor Wafers>

Figure 4:
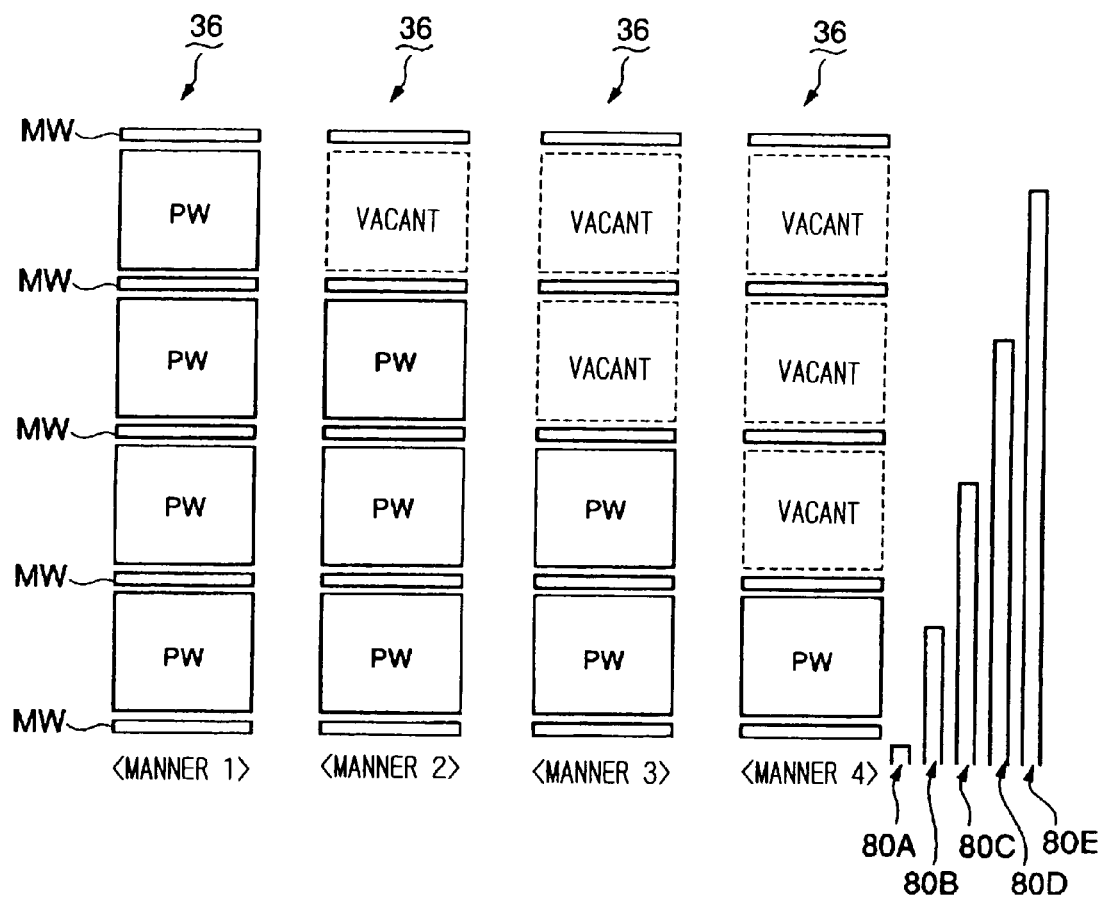
FIG. 4 is a view showing arrangement examples of production wafers onto a wafer boat.

As described above, as shown in FIG. 4, when an oxidation process is actually carried out, product wafers PW which correspond to the maximum containing capacity may be fully contained in the wafer boat 36, or product wafers PW may be partly contained while one or more vacant zones (shown by "vacant" in FIG. 4) are left. In addition, in general, the product wafers PW are filled from the upstream side of the gas flow (the lower side of the wafer boat 36 in FIG. 4). FIG. 4 is a view showing four typical examples of containing manners (arrangement manners) of the product wafers. In FIG. 4, the positions of the reducing-gas ejecting nozzles 80A to 80E are also shown schematically.

In the shown examples, the containing area of the wafer boat 36 is divided into four zones (areas) for the convenience. Monitor wafers MW for measuring film thicknesses are contained at the uppermost part, at the lowermost zone, and between the respective zones. In each zone, for example, twenty-five wafers may be contained. Thus, one hundred wafers may be contained in the four zones. In addition, as described above, in general, the product wafers PW are contained from the upside stream of the gas flow (the lower side of the wafer boat 36 in the shown examples). In a manner 1, the product wafers PW are contained in the all zones. In a manner 2, the product wafers PW are contained in the three zones on the upstream side, and the other zone on the downstream side is a vacant area. In a manner 3, the product wafers PW are contained in the two zones on the upstream side, and the two zones on the downstream side are vacant areas. In a manner 4, the product wafers PW are contained in the one zone on the upstream side, and the three zones on the downstream side are vacant areas. As described above, the manners 1 to 4 are only examples. Depending on the number of the product wafers PW, the production wafers PW may be contained partway in any zone, so that a vacant area may be formed in the zone.

<Relationship Between Supply Condition of $H_2$ Gas from Reducing-Gas Ejecting Nozzles and Film Thickness>

Next, film thicknesses formed by supplying the $H_2$ gas from selected reducing-gas ejecting nozzles were evaluated. The evaluation result is explained.

Figure 5:
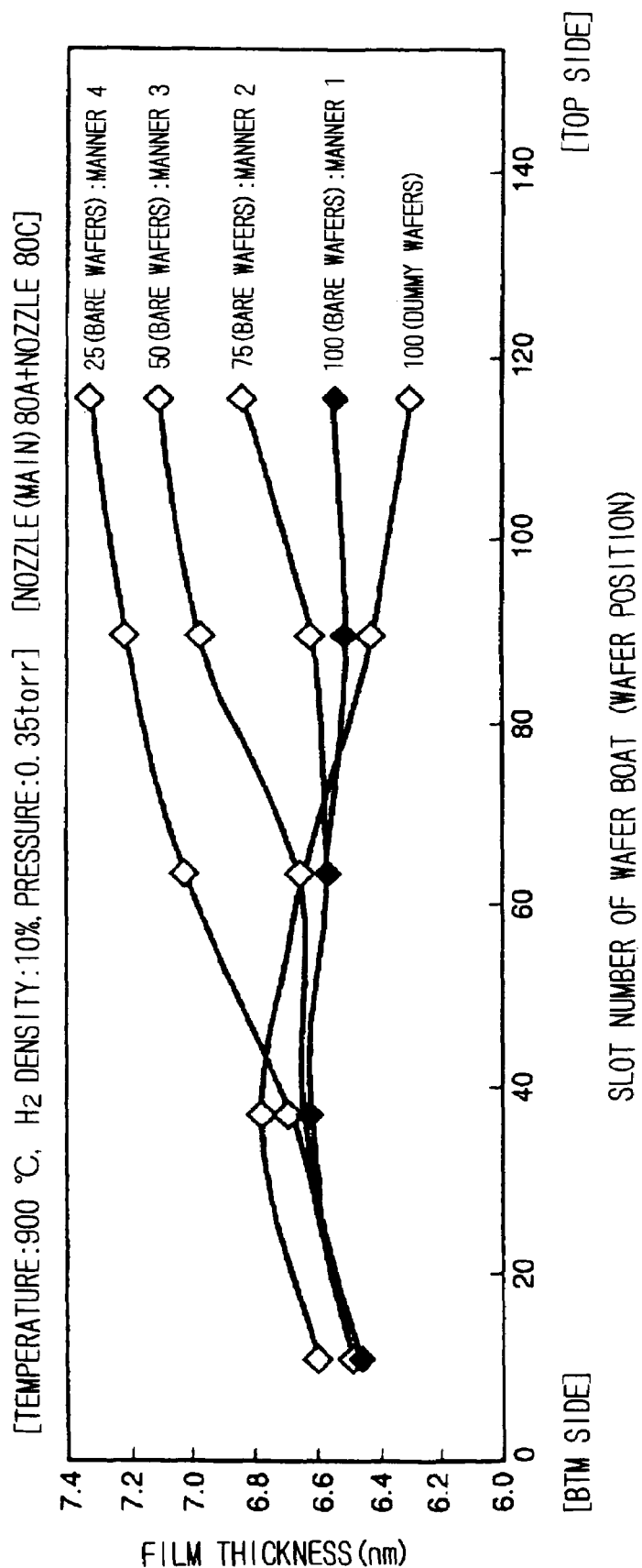
FIG. 5 is a graph showing film thicknesses on respective wafers when the $H_2$ gas is supplied from selected particular reducing-gas ejecting nozzles.

FIG. 5 is a graph showing film thicknesses of oxide films formed at oxidation processes wherein the $H_2$ gas was supplied from selected particular reducing-gas ejecting nozzles. The transverse axis corresponds to numbered slots supporting wafers of the wafer boat 36. The plotted values are film thicknesses on the five monitor wafers MW of FIG. 4. The five monitor wafers MW were respectively located at the numbered slots (grooves for supporting wafers) of "11", "37", "63", "89" and "115" of the wafer boat 36. The $O_2$ gas was supplied from the nozzle 66, and the $H_2$ gas being a reducing gas was supplied from the main nozzle 80A and the central nozzle 80 C. Then, additionally to the four wafer arrangement manners 1 to 4 shown in FIG. 4, for a case wherein dummy wafers (having $SiO_2$ films on surfaces thereof) are contained in the four zones, a film-thickness measuring experiment was carried out. In fact, bare wafers having substantially the same effect as the production wafers PW were used as the production wafers.

The reason for selecting gas ejecting ports to be used from the plurality of reducing-gas ejecting ports 88A to 88E (gas ejecting nozzles 80A to 80E) arranged at the different positions in the longitudinal direction of the processing container 22 is as follows.

That is, density distribution of the reducing-gas in the processing container 22 may be greatly different, depending on a wafer containing manner (arrangement manner), that is, depending on whether the wafers are contained in the wafer boat 36 fully for the maximum containing capacity or not, or depending on whether there is any vacant area or not, if any, depending on where the vacant area is located in the wafer boat 36, or the like. Thus, when the reducing gas is supplied uniformly from the respective gas ejecting ports 88A to 88E arranged at the different positions in the longitudinal direction of the processing container 22, it may be not possible to obtain an optimum gas density distribution. Thus, positive experiments are carried out in advance, so that a gas ejecting port or a combination of the gas ejecting ports is determined in advance in such a manner that an optimum gas density distribution is achieved correspondingly to each wafer containing manner.

Regarding the process condition, the process temperature was 900° C., the process pressure was 47 Pa. The wafer diameter was 200 mm. The flow rate of the $O_2$ gas from the nozzle 66 was fixed to 2.43 slm (standard little minute). The flow rate of the $H_2$ gas from the nozzle 80A was fixed to 0.27 slm, and the flow rate of the $H_2$ gas from the nozzle 80C was fixed to 0.07 slm. That is, the $H_2$ gas density was 10%.

As clearly seen from the film-thickness distribution shown in FIG. 5, it was found that, by only auxiliary adding the $H_2$ gas from the nozzle 80C of the substantially central part to the $H_2$ gas supply from the main nozzle 80A, uniformity of the film thickness in the between-surface direction can be minutely controlled in the respective manners 1 to 4. At that time, the between-surface uniformity of the film thickness in the manner 1 was ±0.95%, the between-surface uniformity of the film thickness in the manner 2 was ±0.96%, the between-surface uniformity of the film thickness in the manner 3 was ±1.14%, and the between-surface uniformity of the film thickness in the manner 4 was ±1.67%.

In the example of FIG. 5, the flow rate of the $H_2$ gas from the nozzle 80C was fixed to 0.07 slm. Next, the flow rate of the $H_2$ gas from the nozzle 80C was changed to be evaluated.

Figure 6:
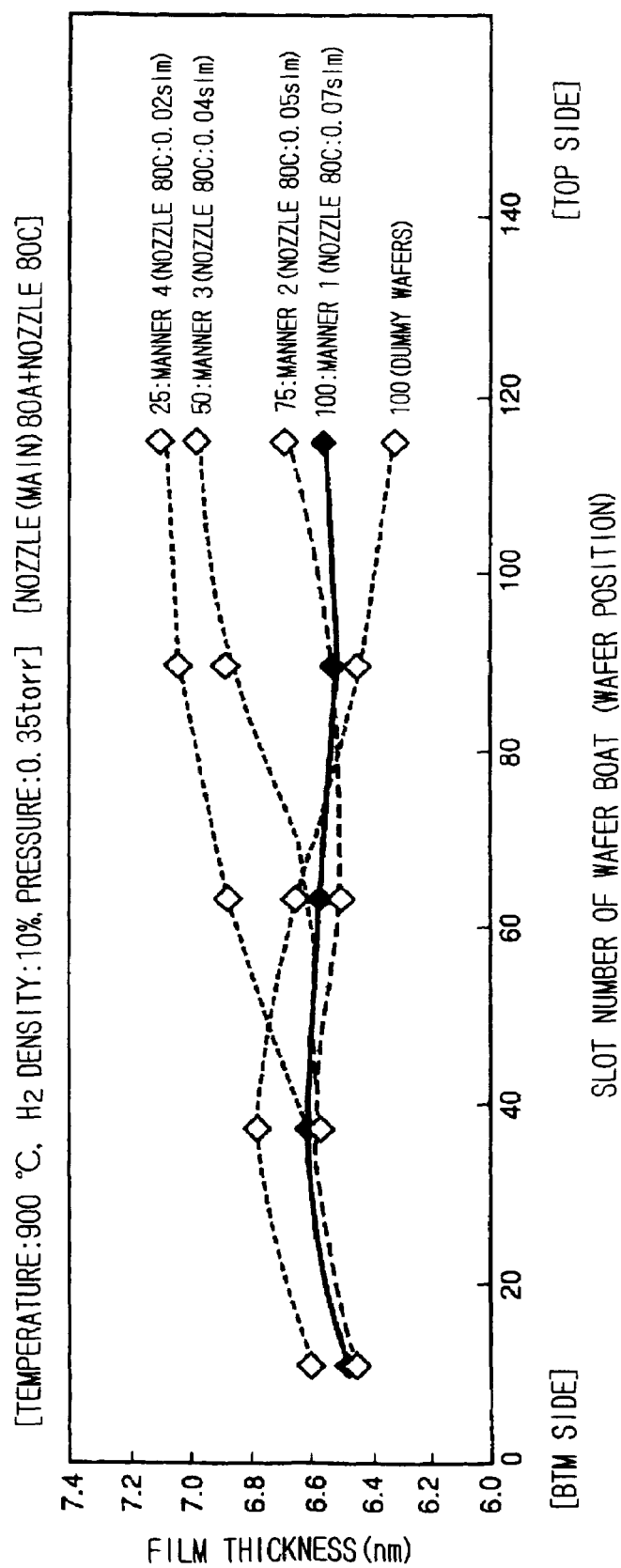
FIG. 6 is a graph showing film thicknesses on respective wafers when a flow rate of the $H_2$ gas from an auxiliary nozzle is changed while a flow rate of the $H_2$ gas from a main nozzle is constant.

FIG. 6 is a graph showing film thicknesses when a flow rate of the $H_2$ gas from an auxiliary nozzle is changed while a flow rate of the $H_2$ gas from the main nozzle is constant. In the example of FIG. 6, the same process condition as the example of FIG. 5 was used except that the flow rate of the $H_2$ gas from the nozzle 80C was changed. Herein, the flow rate of the $H_2$ gas from the nozzle 80C was changed within a range of 0.02 slm to 0.07 slm correspondingly to the wafer containing manners 1 to 4, in such a manner that the flow rate of the $H_2$ gas from the nozzle 80C is larger as the containing number of the product wafers (bare wafers) is larger.

According to the example of FIG. 6, it was found that fluctuation of the film thickness in the between-surface direction can be inhibited much more. At that time, the between-surface uniformity of the film thickness in the manner 1 was ±0.95%, the between-surface uniformity of the film thickness in the manner 2 was ±0.90%, the between-surface uniformity of the film thickness in the manner 3 was ±0.96%, and the between-surface uniformity of the film thickness in the manner 4 was ±1.26%. That is, as a whole, the between-surface uniformity of the film thickness was improved compared with the case of FIG. 5.

As shown in FIGS. 5 and 6, regarding the supply of the reducing gas, it was found that the between-surface uniformity of the film thickness can be improved by accessorily supplying the reducing gas from one auxiliary nozzle, for example the nozzle 80C. Regarding the other nozzles 80B, 80D and 80E as well, the same oxidation process as explained with FIGS. 5 and 6 is carried out in advance, so that data of film thickness distribution can be obtained. Then, based on the data of film thickness distribution, for each of the wafer containing manners 1 to 4 shown in FIG. 4, a nozzle combination selected from the nozzles 80A to 80E is determined in advance in such a manner that the between-surface uniformity of the film thickness can be maintained high. In addition, the gas flow rate from each selected nozzle is also optimized and determined in advance.

When the number of wafer containing manners for the film thickness measuring experiments is increased, control precision of the gas flow rate can be enhanced. At an actual oxidation process, the reducing gas is supplied by a nozzle combination obtained for a wafer containing manner corresponding to a wafer arrangement manner at that process, or by a nozzle combination obtained for a wafer containing manner the nearest thereto. Then, the gas flow rate is also controlled.

Figure 7:
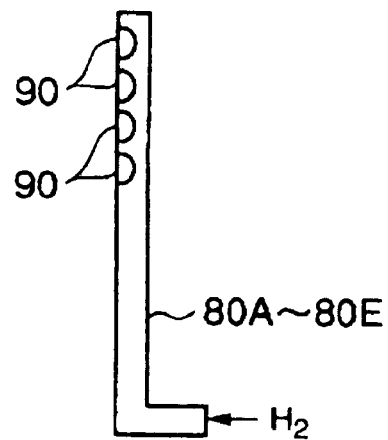
FIG. 7 is a view showing a modified structural example of a reducing-gas ejecting nozzle.

In addition, each reducing-gas ejecting nozzle 80A to 80E has a gas ejecting port at the tip end. Instead of that, for example as shown in FIG. 7, each reducing-gas ejecting nozzle 80A to 80E may have a plurality of gas ejecting ports 90 formed at a predetermined pitch in the longitudinal direction. In the case, the reducing gas may be dispersed and supplied.

In addition, in the example of FIG. 1, the $O_2$ gas and the main $H_2$ gas are supplied from the lower portion of the processing container 22, the upward gas flow is formed in the processing container 22, and the gas flow is adapted to be discharged from the gas-discharging port 24 at the ceiling port of the processing container 22. However, this invention is not limited thereto, another structure shown in FIG. 8 may be also adopted.

Figure 8:
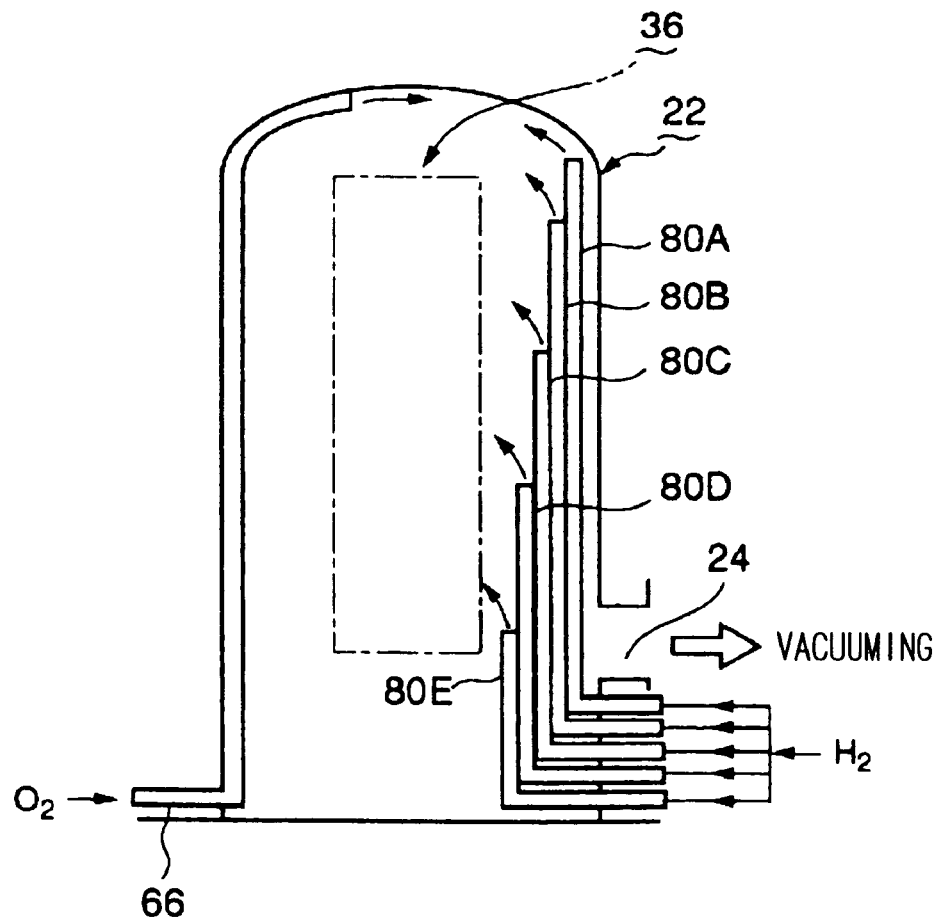
FIG. 8 is a schematic structural view showing another modified embodiment of an oxidizing unit.
Figure 9:
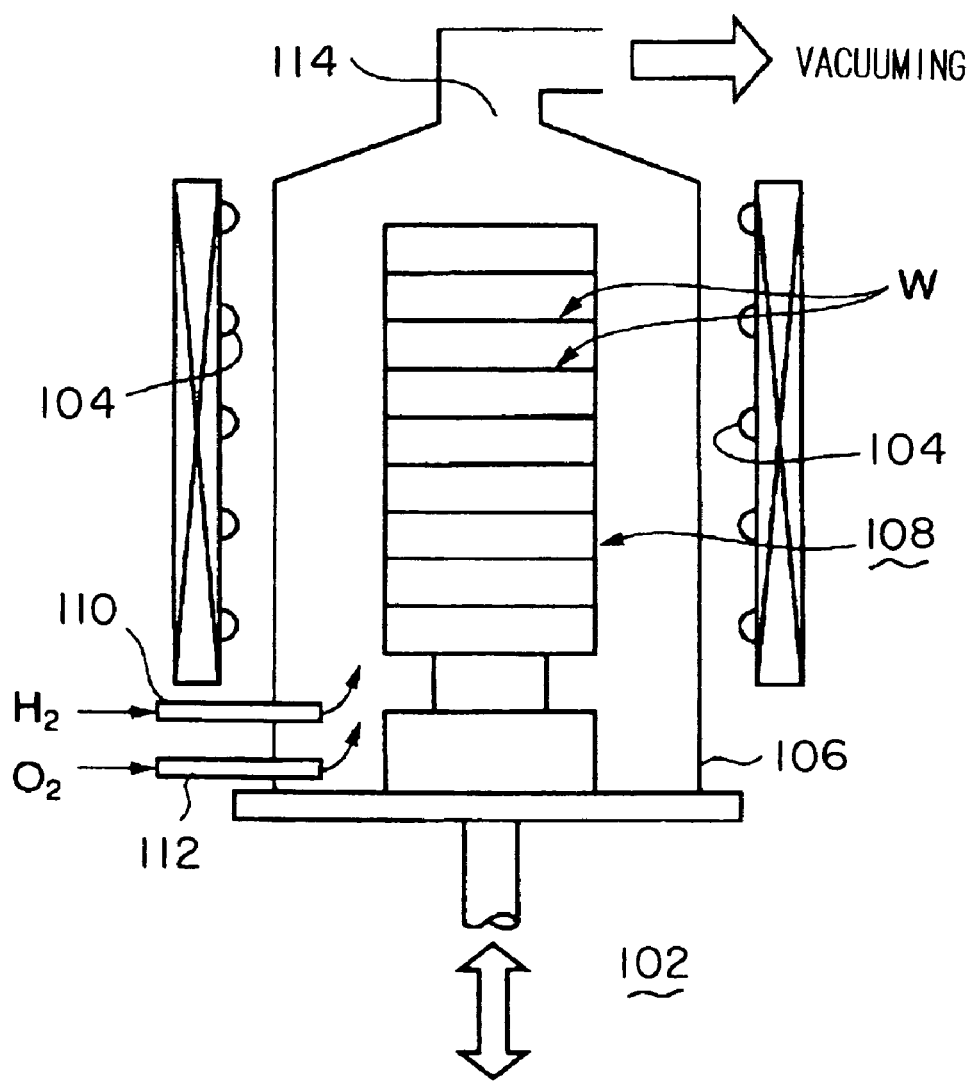
FIG. 9 is a schematic structural view showing a conventional oxidizing unit.

FIG. 8 is a schematic structural view showing a modified embodiment of the oxidizing unit. In the case shown in FIG. 8, the nozzles 66 and 80A supplying the $O_2$ gas and the main $H_2$ gas are respectively arranged along an inside wall of the processing container 22. The gas ejecting ports thereof are arranged at the container ceiling part. Then, the gas-discharging port 24 is provided at a lower side wall, instead of at the container ceiling part. Thus, opposite to the case of FIG. 1, a downward gas flow is formed in the processing container 22.

In the case shown in FIG. 8, the relationship from the upstream zone S4 to the downstream zone S1 shown in FIG. 1 is inversed upside down. In addition, the gas supplying manner from the reducing-gas ejecting nozzles 80A to 80E is also inversed upside down from the case of FIG. 1.

In addition, in the above embodiments, the reducing gas is always supplied from the main nozzle 80A. However, this invention is not limited thereto. The gas supply from the nozzle 80A may be stopped, and the reducing gas may be selectively supplied from the other nozzles 80B to 80E.

In addition, in general, the product wafers PW are filled in the wafer boat 36 from the upstream side of the gas flow. However, this invention is not limited thereto. The product wafers PW may be contained at any positions in the wafer boat 36. In that case too, if a reducing-gas ejecting nozzle to be selected for supplying the reducing gas is determined in advance correspondingly to a possible wafer containing manner, this invention is applicable.

In the above embodiments, the $O_2$ gas is used as an oxidative gas. However, this invention is not limited thereto. An $N_2O$ gas, an NO gas, an $NO_2$ gas and the like may be used. In addition, in the above embodiments, the $H_2$ gas is used as a reducing gas. However, this invention is not limited thereto. An $NH_3$ gas, a $CH_4$ gas, an HCl gas and the like may be used.

In addition, this invention is applicable to an LCD substrate, a glass substrate or the like, as an object to be processed, instead of the semiconductor wafer.

The invention claimed is:

1. An oxidizing method for an object to be processed, the oxidizing method comprising:
    an arranging step of arranging a plurality of objects to be processed in a processing container whose inside can be vacuumed, the processing container having a predetermined length, a supplying unit of an oxidative gas being provided at one end of the processing container, a plurality of supplying units of a reducing gas being provided at a plurality of positions in a longitudinal direction of the processing container;
    an atmosphere forming step of supplying the oxidative gas and the reducing gas into the processing container in order to form an atmosphere having active oxygen species and active hydroxyl species in the processing container; and
    an oxidizing step of oxidizing surfaces of the plurality of objects to be processed in the atmosphere;
    wherein the atmosphere forming step has:
    a selecting step of selecting a predetermined supplying unit among the plurality of reducing gas supplying units of, based on the number of the objects to be processed in the processing container, and based on respective arrangement positions of the plurality of objects to be processed in the processing container;
    an oxidative-gas supplying step of supplying the oxidative gas into the processing container from the oxidative gas supplying unit; and
    an reducing-gas supplying step of supplying the reducing gas into the processing container only from the reducing gas supplying unit selected by the selecting step.

2. An oxidizing method for an object to be processed according to claim 1, wherein
    the reducing gas supplying unit selected by the selecting step is determined in advance, based on film thicknesses of oxide films formed by supplying the reducing gas by respective selective patterns of the plurality of supplying units, in such a manner that uniformity between surfaces of the film thicknesses of the oxide films is high.

3. An oxidizing method for an object to be processed according to claim 2, wherein
    the reducing gas is supplied in the reducing-gas supplying step while the reducing gas is controlled to an optimum flow rate.

4. An oxidizing method for an object to be processed according to claim 2, wherein
    density of the reducing gas in total of the oxidative gas and the reducing gas is between 5% and 40%.

5. An oxidizing method for an object to be processed according to claim 2, wherein
    the oxidative gas includes one or more gases selected from a group consisting of $O_2$, $N_2O$, NO, $NO_2$ and $NO_3$, and
    the reducing gas includes one or more gases selected from a group consisting of $H_2$, $NH_3$, $CH_4$, HCl and deuterium.

6. An oxidizing method for an object to be processed according to claim 2, wherein
    the objects to be processed consist of a production wafer and a monitor wafer.

7. An oxidizing method for an object to be processed according to claim 2, wherein
    the objects to be processed consist of only production wafers.

8. An oxidizing method for an object to be processed according to claim 1, wherein
    the reducing gas is supplied in the reducing-gas supplying step while the reducing gas is controlled to an optimum flow rate.

9. An oxidizing method for an object to be processed according to claim 1, wherein
    density of the reducing gas in total of the oxidative gas and the reducing gas is between 5% and 40%.

10. An oxidizing method for an object to be processed according to claim 1, wherein
    the oxidative gas includes one or more gases selected from a group consisting of $O_2$, $N_2O$, NO, $NO_2$ and $NO_3$, and
    the reducing gas includes one or more gases selected from a group consisting of $H_2$, $NH_3$, $CH_4$, HCl and deuterium.

11. An oxidizing method for an object to be processed according to claim 1, wherein
    the objects to be processed consist of a production wafer and a monitor wafer.

12. An oxidizing method for an object to be processed according to claim 1, wherein
    the objects to be processed consist of only production wafers.

13. A storage medium capable of being read by a computer, storing software for controlling an oxidizing method for an object to be processed,
    the oxidizing method comprising:
    an arranging step of arranging a plurality of objects to be processed in a processing container whose inside can be vacuumed, the processing container having a predetermined length, a supplying unit of an oxidative gas being provided at one end of the processing container, a plurality of supplying units of a reducing gas being provided at a plurality of positions in a longitudinal direction of the processing container;
    an atmosphere forming step of supplying the oxidative gas and the reducing gas into the processing container in order to form an atmosphere having active oxygen species and active hydroxyl species in the processing container; and
    an oxidizing step of oxidizing surfaces of the plurality of objects to be processed in the atmosphere;
    wherein the atmosphere forming step has:
    a selecting step of selecting a predetermined supplying unit among the plurality of reducing gas supplying units of, based on the number of the objects to be processed in the processing container, and based on the positions of the plurality of objects to be processed in the processing container;
    an oxidative-gas supplying step of supplying the oxidative gas into the processing container from the oxidative gas supplying unit; and
    an reducing-gas supplying step of supplying the reducing gas into the processing container only from the reducing gas supplying unit selected by the selecting step.

* * * * *